US012615732B2

(12) United States Patent
Mundt et al.

(10) Patent No.: US 12,615,732 B2
(45) Date of Patent: Apr. 28, 2026

(54) MOUNTED CIRCUIT BOARD/FLOATING CIRCUIT BOARD COMPONENT CONNECTION SYSTEM

(71) Applicant: Dell Products L.P., Round Rock, TX (US)

(72) Inventors: Kevin Warren Mundt, Austin, TX (US); Michael Gregoire, Waltham, MA (US); Stephen Strickland, Foxborough, MA (US); William Andrew Smith, Round Rock, TX (US); Anand Nunna, Georgetown, TX (US); Quy Ngoc Hoang, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 139 days.

(21) Appl. No.: 18/763,539

(22) Filed: Jul. 3, 2024

(65) Prior Publication Data

US 2026/0013065 A1     Jan. 8, 2026

(51) Int. Cl.
*H05K 7/14* (2006.01)
(52) U.S. Cl.
CPC .................................. *H05K 7/1487* (2013.01)
(58) Field of Classification Search
CPC .............................. H05K 7/14; H05K 7/1487
See application file for complete search history.

(56) References Cited

U.S. PATENT DOCUMENTS

| | | | |
|---|---|---|---|
| 9,048,601 | B2 | 6/2015 | Kimura |
| 2015/0022990 | A1* | 1/2015 | French, Jr. ............. H05K 3/368 |
| | | | 361/792 |
| 2021/0399450 | A1* | 12/2021 | Herring ................... H05K 3/32 |

OTHER PUBLICATIONS

HARWiN, "Introducing Flecto," The latest in floating connector technology, Harwin 2024, 11 pages. Retrieved from the Internet: https://www.harwin.com/flecto.

Ryan Smart, "Floating Board-to-Board Connectors," Supporting High-Speed, Automated Assembly for Multiple PCB Connectors, Harwin 2024, 10 pages. Retrieved from the Internet: https://www. mouser.com/pdfDocs/HarwinFlectoWhitepaper.pdf.

HARWiN, "Flecto Floating Connectors," Fine Pitch Board-To-Board Connectors With High Pin Count, Harwin 2024, 7 pages. Retrieved from the Internet: https://cdn.harwin.com/pdfs/Harwin_ Datasheet-FLECTO.pdf.

* cited by examiner

*Primary Examiner* — Jerry Wu
(74) *Attorney, Agent, or Firm* — Joseph Mencher

(57) ABSTRACT

A mounted circuit board/floating circuit board component connection system includes a computing device chassis. A mounted circuit board includes a plurality of first component connectors that are configured to connect to a component, and is mounted to the computing device chassis such that relative movement of the mounted circuit board and the computing device chassis is resisted. A floating circuit board includes a plurality of second component connectors that are configured to connect to the component, and is moveably coupled to the computing device chassis such that the floating circuit board is configured to move relative to the computing device chassis when the component connects to the plurality of first component connectors included on the mounted circuit board.

20 Claims, 14 Drawing Sheets

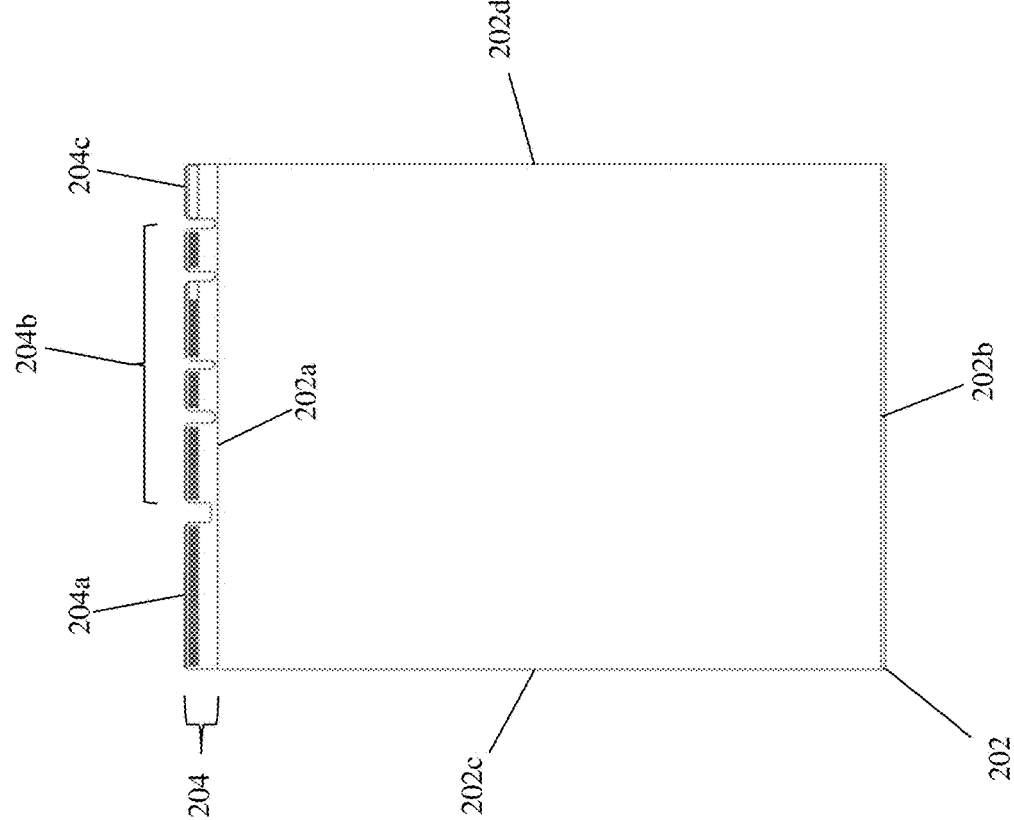
(PRIOR ART)
FIG. 2

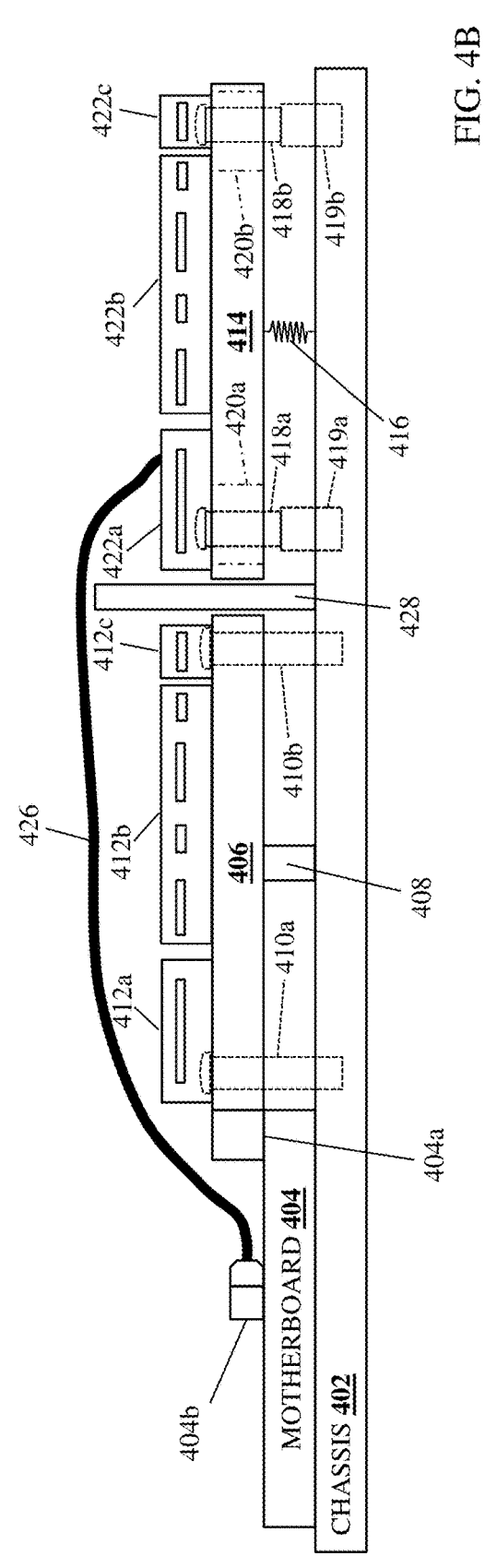
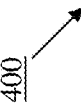
FIG. 4B

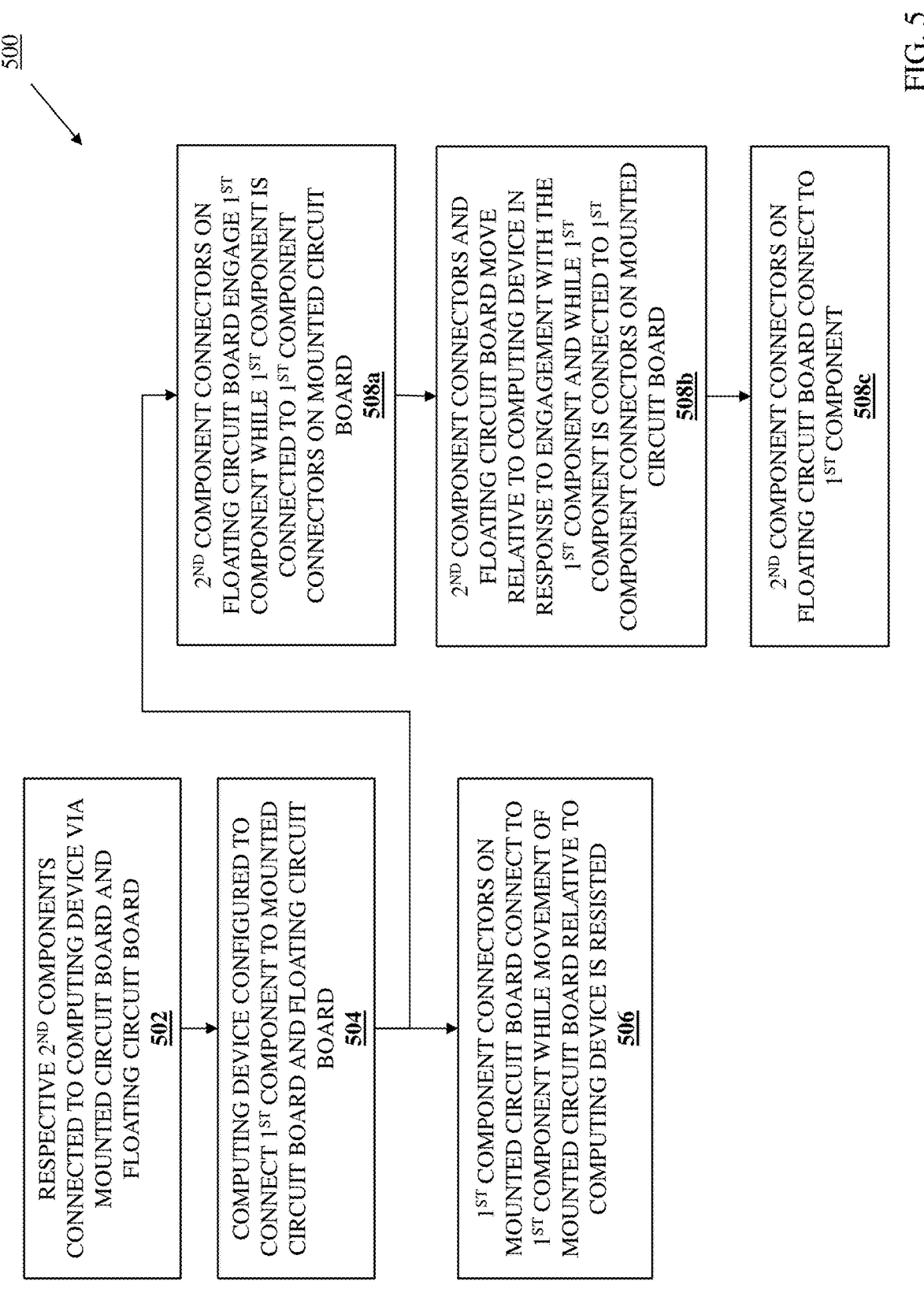

RESPECTIVE 2ND COMPONENTS CONNECTED TO COMPUTING DEVICE VIA MOUNTED CIRCUIT BOARD AND FLOATING CIRCUIT BOARD
502

COMPUTING DEVICE CONFIGURED TO CONNECT 1ST COMPONENT TO MOUNTED CIRCUIT BOARD AND FLOATING CIRCUIT BOARD
504

1ST COMPONENT CONNECTORS ON MOUNTED CIRCUIT BOARD CONNECT TO 1ST COMPONENT WHILE MOVEMENT OF MOUNTED CIRCUIT BOARD RELATIVE TO COMPUTING DEVICE IS RESISTED
506

2ND COMPONENT CONNECTORS ON FLOATING CIRCUIT BOARD ENGAGE 1ST COMPONENT WHILE 1ST COMPONENT IS CONNECTED TO 1ST COMPONENT CONNECTORS ON MOUNTED CIRCUIT BOARD
508a

2ND COMPONENT CONNECTORS AND FLOATING CIRCUIT BOARD MOVE RELATIVE TO COMPUTING DEVICE IN RESPONSE TO ENGAGEMENT WITH THE 1ST COMPONENT AND WHILE 1ST COMPONENT IS CONNECTED TO 1ST COMPONENT CONNECTORS ON MOUNTED CIRCUIT BOARD
508b

2ND COMPONENT CONNECTORS ON FLOATING CIRCUIT BOARD CONNECT TO 1ST COMPONENT
508c

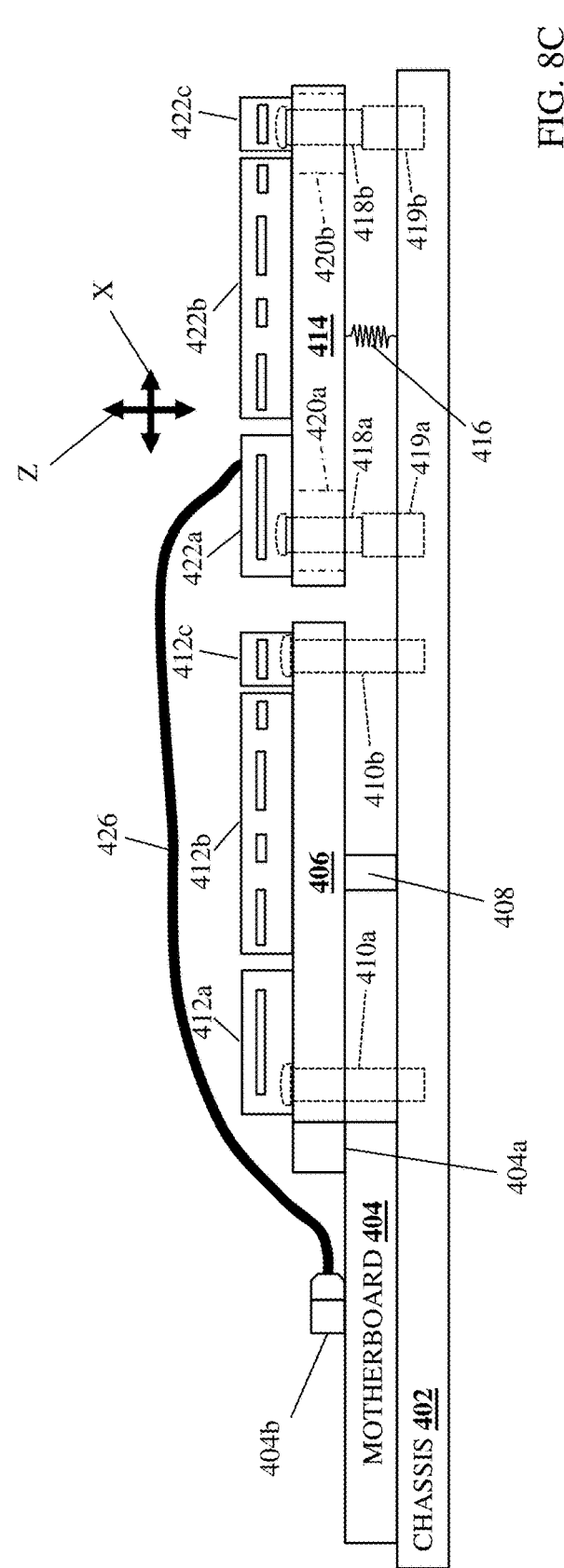
FIG. 8C

MOUNTED CIRCUIT BOARD/FLOATING CIRCUIT BOARD COMPONENT CONNECTION SYSTEM

BACKGROUND

The present disclosure relates generally to information handling systems, and more particularly to using a mounted circuit board and a floating circuit board to connect a component to an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handlings systems such as, for example, server devices and/or other computing devices known in the art, typically utilize a wide variety of components, and efforts are ongoing to standardize optimized component configurations for use with such computing devices. For example, the Storage Networking Industry Association (SNIA) is developing a Pluggable Multipurpose Module (PMM) component (e.g., see the SFF-TA-1034 specification for the PMM, revision 0.0.5, released Apr. 5, 2024) that is optimized for use with computing devices provided in Enterprise and Datacenter applications, and defines a pin list and pin placement, pin functionality, device-specific electrical requirements, and specific features of PMM components, while relying on other specifications (e.g., the SFF-TA-1037 specification) for connector mechanical details for such PMM components. The PMM components discussed above include a plurality of PMM component connectors that provide the pins discussed above and that are included on a circuit board that is defined to have particular dimensions (e.g., a "specification-defined" length and width referred to as "specification-defined" dimensions below), which the inventors of the present disclosure have recognized will raise some issues.

For example, the specification-defined dimensions defined for PMM components include "short" PMM component dimensions (e.g., 167 mm length×120 mm width) and "long" PMM component dimensions (e.g., 230 mm length×120 mm width). While these specification-defined dimensions for PMM components are currently appropriate for providing conventional Data Processing Unit (DPU) functionality via such PMM components, providing Graphics Processing Unit (GPU) functionality on such PMM components is already becoming a challenge due to the amount of circuit board space that is required by GPUs and their supporting subsystems. Furthermore, the relatively long and thin rectangular shape provided by the specification-defined dimensions for PMM components requires a "thermally-serial" positioning of subsystems on the circuit board of the PMM component, and often results in air that is used to cool a "first" subsystem on the circuit board of the PMM component being heated by the "first" subsystem before being provided to cool "second" subsystems on the circuit board of the PMM component, thus reducing efficiency in cooling the subsystems on the PMM component.

As discussed in further detail below, the inventors of the present disclosure are proposing the increase of the specification-defined width dimension of the PMM components discussed above to approximately double that provided in the specification-defined dimensions (e.g., a "double-wide" width that, when used with the length dimensions defined by the specification-defined dimensions discussed above, are referred to as "double wide" dimensions below) in order to address the issues described above. Furthermore, the inventors of the present disclosure expect that computing devices will include multiple, side-by-side PMM component bays that each have a respective set of computing device connectors for the corresponding set of PMM component connectors on their respective PMM component, and thus have developed PMM components that have "double wide" dimensions and that include two side-by-side sets of the PMM component connectors discussed above that may each connect to a respective set of computing device connectors in adjacent PMM component bays. However, achieving the pin alignment required to enable the connection of the single set of PMM component connectors on PMM components having specification-defined dimensions to a corresponding set of computing device connectors is already difficult, and thus the addition of a second set of PMM component connectors on the same circuit board as the first set of PMM connectors and their connector to PMM components with the "double-wide" dimensions discussed above is expected to present significant issue in the manufacture and use of such PMM components.

Accordingly, it would be desirable to provide a component connection system that addresses the issues discussed above.

SUMMARY

According to one embodiment, an Information Handling System (IHS) includes a first component; a computing device; a mounted circuit board that includes a plurality of first component connectors that are connected to the first component, wherein the mounted circuit board is mounted to the computing device to resist relative movement of the mounted circuit board and the computing device; and a floating circuit board that includes a plurality of second component connectors that are connected to the first component, wherein the floating circuit board is moveably coupled to the computing device chassis to allow relative movement of the floating circuit board and the computing device when the first component connects to the plurality of first component connectors included on the mounted circuit board.

BRIEF DESCRIPTION OF THE DRAWINGS

FIG. 2 is a schematic view illustrating an embodiment of a conventional component that may be used with the mounted circuit board/floating circuit board component connection system of the present disclosure.

FIG. 4B is a schematic front view illustrating an embodiment of the computing device of FIG. 4A that includes the mounted circuit board/floating circuit board component connection system of the present disclosure.

FIG. 5 is a flow chart illustrating an embodiment of a method for connecting a component to a computing device using a mounted circuit board and a floating circuit board.

FIG. 8C is a schematic front view illustrating an embodiment of the computing device of FIGS. 4A and 4B operating during the method of FIG. 5.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
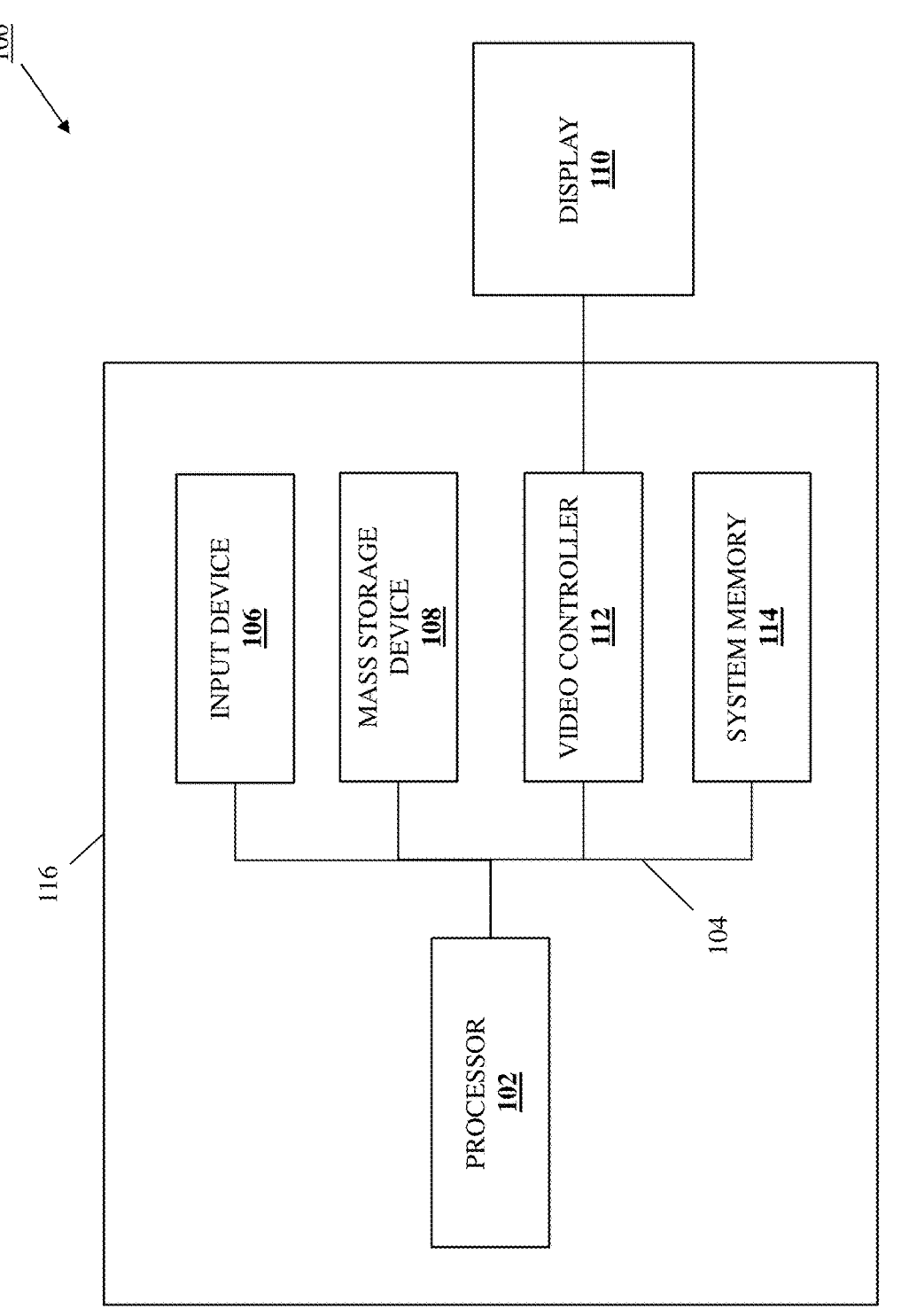
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIG. 2, an embodiment of a conventional component 200 is illustrated that may be used with the mounted circuit board/floating circuit board component connection system of the present disclosure. In the embodiments illustrated and described below, the conventional component 200 is provided by a conventional Pluggable Multipurpose Module (PMM) component that includes conventional PMM dimensions (e.g., the 167 mm length×120 mm width dimensions for conventional "short" PMM components discussed above, and the 230 mm length×120 mm width dimensions for conventional "long" PMM components discussed above). However, while illustrated and discussed as being provided by a conventional PMM component having conventional PMM dimensions, one of skill in the art in possession of the present disclosure will recognize that the conventional components that may be used with the mounted circuit board/floating circuit board component connection system of the present disclosure may be provided by any of a variety of conventional components with any of a variety of conventional component dimensions that would be apparent to one of skill in the art in possession of the present disclosure.

In the illustrated embodiment, the conventional component 200 includes a chassis 202 (e.g., a circuit board) that supports the subsystems of the conventional component 200, only some of which are illustrated and described below. In the illustrated embodiment, the chassis 202 includes a front edge 202a, a rear edge 202b that is located opposite the chassis 202 from the front edge 202a, and a pair of opposing side edges 202c and 202d that extend between the front edge 202*a* and the rear edge 202*b* and that are located opposite the chassis 202 from each other. Furthermore, in the illustrated embodiment, a plurality of computing device connectors 204 extend from the front edge of the chassis 202 between the side edges 202*c* and 202*d*. As will be appreciated by one of skill in the art in possession of the present disclosure, the length of the conventional component 200 discussed below may be measured between the front edge 202*a* and the rear edge 202*b* (and in some cases including the computing device connectors 204 as well), while the width of the conventional component 200 discussed below may be measured between the side edges 202*c* and 202*d*.

In the embodiments illustrated and described below, the plurality of computing device connectors 204 are provided by a set of conventional PMM computing device connectors that one of skill in the art will recognize include a computing device connector 204*a* that is provided by a ×16 Peripheral Component Interconnect express (PCIe) connector; a set of computing device connectors 204*b* that provide a ×16 PCIe connection, a sideband signal connection, and a 200 watt power connection; and a computing device connector 204*c* that is provided by a 400 W power connector. As will be appreciated by one of skill in the art in possession of the present disclosure, the conventional PMM component may be configured as a "base-feature" conventional PMM component with only the x16 PCIe connection and 200 watt power connection on the set of computing device connectors 204*b* enabled, or may be configured as an "enhanced-feature" conventional PMM component with a ×32 PCIe connection and a 600 watt power connection provided via the enablement of the x16 PCIe connector provided by the computing device connector 204*a* and the 400 W power connector provided by the computing device connector 204*c* (i.e., in addition to the enablement of the base features discussed above via the set of component device connectors 204*b*).

As discussed above, while such conventional PMM components are currently appropriate for providing DPU functionality via such PMM components, providing GPU functionality on such PMM components is already becoming a challenge due to the amount of circuit board space that is required by GPUs and their supporting subsystems. Furthermore, the relatively long and thin rectangular shape of such conventional PMM components requires a "thermally-serial" positioning of subsystems on the conventional PMM component (e.g., with those subsystems positioned "one-in-front-of-the-other" along the length of the chassis 202 between its front edge 202*a* and rear edge 202*b*), and often results in air that is used to cool a "first" subsystem on the conventional PMM component being heated by the "first" subsystem before being provided to cool "second" subsystems on the conventional PMM component, thus reducing efficiency in cooling the subsystems on the conventional PMM component. However, while a specific conventional component 200 has been illustrated and described, conventional components used with the mounted circuit board/floating circuit board component connection system of the present disclosure may be configured in a variety of manners that will fall within the scope of the present disclosure as well.

Figure 3:
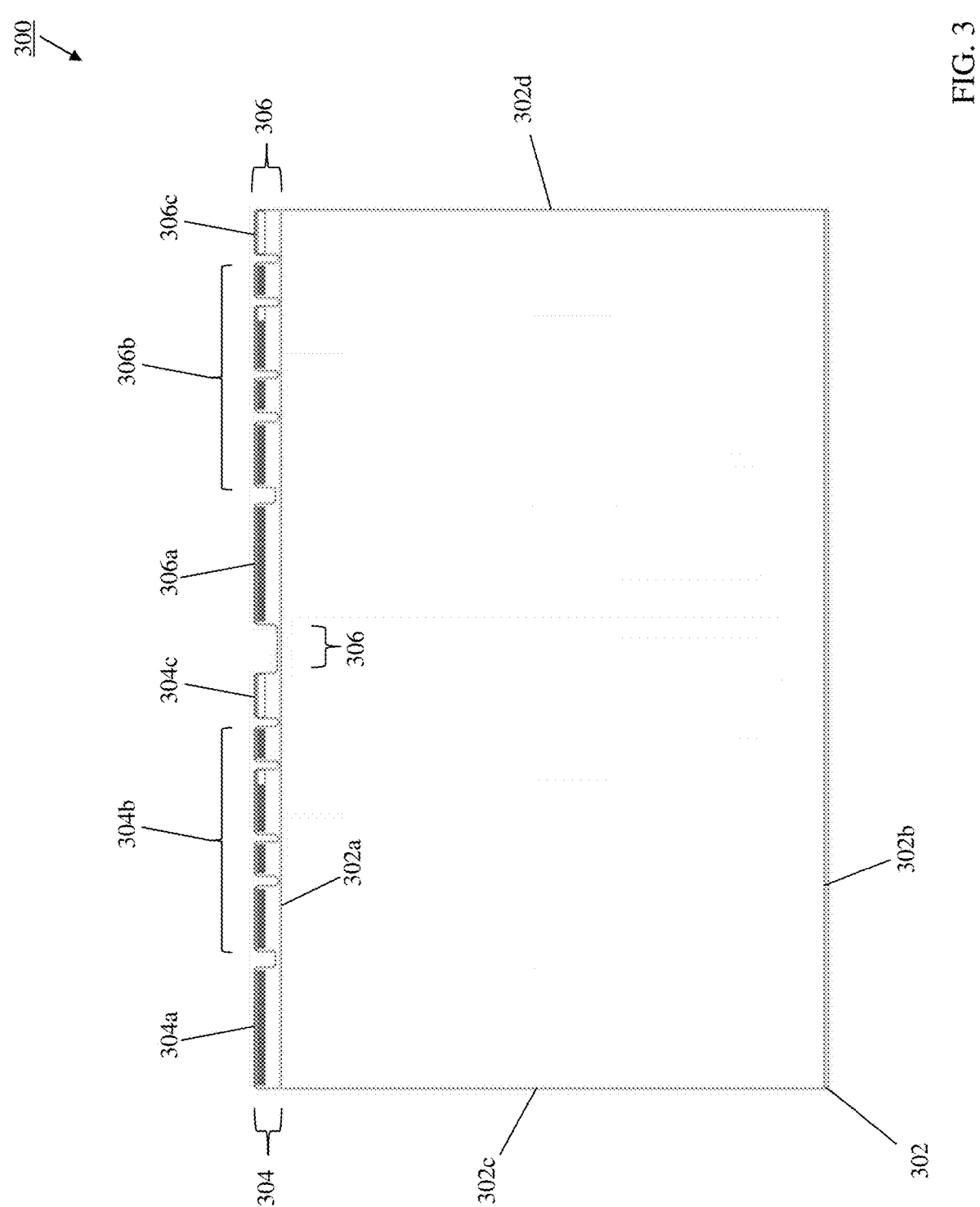
FIG. 3 is a schematic view illustrating an embodiment of a component that may be provided according to the teachings of the present disclosure for use with the mounted circuit board/floating circuit board component connection system of the present disclosure.

Referring now to FIG. 3, an embodiment of a component 300 is illustrated that may be provided according to the teachings of the present disclosure for use with the mounted circuit board/floating circuit board component connection system of the present disclosure. In the embodiments illustrated and described below, the component 300 is provided by a "double-wide" PMM component that includes a "double-width" PMM dimension that is approximately double that of the conventional width PMM dimension of the conventional PMM components described above. For example, one of skill in the art in possession of the present disclosure will appreciate how embodiments that provide the "double-wide" PMM component as the component 300 may include a "double-width" PMM dimension that is equal to twice that of the conventional width PMM dimension described above, plus some added width to provide the spacing between the two sets of PMM component connectors discussed below. However, while illustrated and discussed as being provided by a "double-wide" PMM component, one of skill in the art in possession of the present disclosure will recognize that the components provided according to the teachings of the present disclosure for use with the mounted circuit board/floating circuit board component connection system of the present disclosure may be provided with any of a variety of component dimensions that would be apparent to one of skill in the art in possession of the present disclosure.

In the illustrated embodiment, the component 300 includes a chassis 302 (e.g., a circuit board) that supports the subsystems of the component 300, only some of which are illustrated and described below. In the illustrated embodiment, the chassis 302 includes a front edge 302*a*, a rear edge 302*b* that is located opposite the chassis 302 from the front edge 302*a*, and a pair of opposing side edges 302*c* and 302*d* that extend between the front edge 302*a* and the rear edge 302*b* and that are located opposite the chassis 302 from each other. Furthermore, in the illustrated embodiment, a plurality of computing device connectors 304 extend from the front edge of the chassis 302 between the side edge 302*c* and a middle of the chassis 302 (i.e., e.g., midway between the side edges 302*c* and 302*d*), and a plurality of computing device connectors 306 extend from the front edge of the chassis 302 between the side edge 302*d* and a middle of the chassis (i.e., midway between the side edges 302*c* and 302*d*). As will be appreciated by one of skill in the art in possession of the present disclosure, the length of the component 300 discussed below may be measured between the front edge 302*a* and the rear edge 302*b* (and in some cases including the computing device connectors 304 and 306), while the width of the component 300 discussed below may be measured between the side edges 302*c* and 302*d*.

In the embodiments illustrated and described below, the plurality of computing device connectors 304 are provided by a set of conventional PMM computing device connectors that one of skill in the art will recognize are similar to the conventional PMM computing device connectors 204 on the conventional component 200 discussed above with reference to FIG. 2, and include a computing device connector 304*a* that is provided by a ×16 PCIe connector; a set of computing device connectors 304*b* that provide a ×16 PCIe connection, a sideband signal connection, and a 200 watt power connection; and a computing device connector 304*c* that is provided by a 400 W power connector. In the embodiments illustrated and described below, the plurality of computing device connectors 306 are also provided by a set of conventional PMM computing device connectors that one of skill in the art will recognize are similar to the conventional PMM computing device connectors 204 on the conventional component 200 discussed above with reference to FIG. 2, and include a computing device connector 306*a* that is provided by a ×16 PCIe connector; a set of computing device connectors 306*b* that provide a ×16 PCIe connection, a sideband signal connection, and a 200 watt power connection; and a computing device connector 306c that is provided by a 400 W power connector.

As illustrated in FIG. 3, the plurality of computing device connectors 304 and the plurality of computing device connectors 306 are separated by a spacing 306, and one of skill in the art in possession of the present disclosure will appreciate how the "double-width" PMM dimension of the component 300 as measured between the side edges 302c and 302d of the chassis 302 is approximately double that of the conventional width PMM dimension of the conventional PMM components described above (i.e., the "double-width" PMM dimension is twice the conventional width PMM dimension plus the spacing 306).

As will be appreciated by one of skill in the art in possession of the present disclosure, the "double-width" PMM component described above addresses the issues with conventional PMM components by increasing the amount of circuit board space available and required by GPUS and supporting subsystems, thus enabling a variety of GPU functionality that is not available using conventional PMM components. Furthermore, the "double-width" PMM component allows a "thermally-parallel" positioning of subsystems on the "double-width" PMM component (e.g., with those subsystems positioned "side-by-side" along the width of the chassis 200 between its side edges 202c and 202d), preventing the cooling issues discussed above with conventional PMM components and increasing the efficiency in cooling the subsystems on the "double-wide" PMM component relative to conventional PMM components. However, while a specific component 300 has been illustrated and described, components that may be provided according to the teachings of the present disclosure for use with the mounted circuit board/floating circuit board component connection system of the present disclosure may be configured in a variety of manners that will fall within the scope of the present disclosure as well.

Figure 4A:
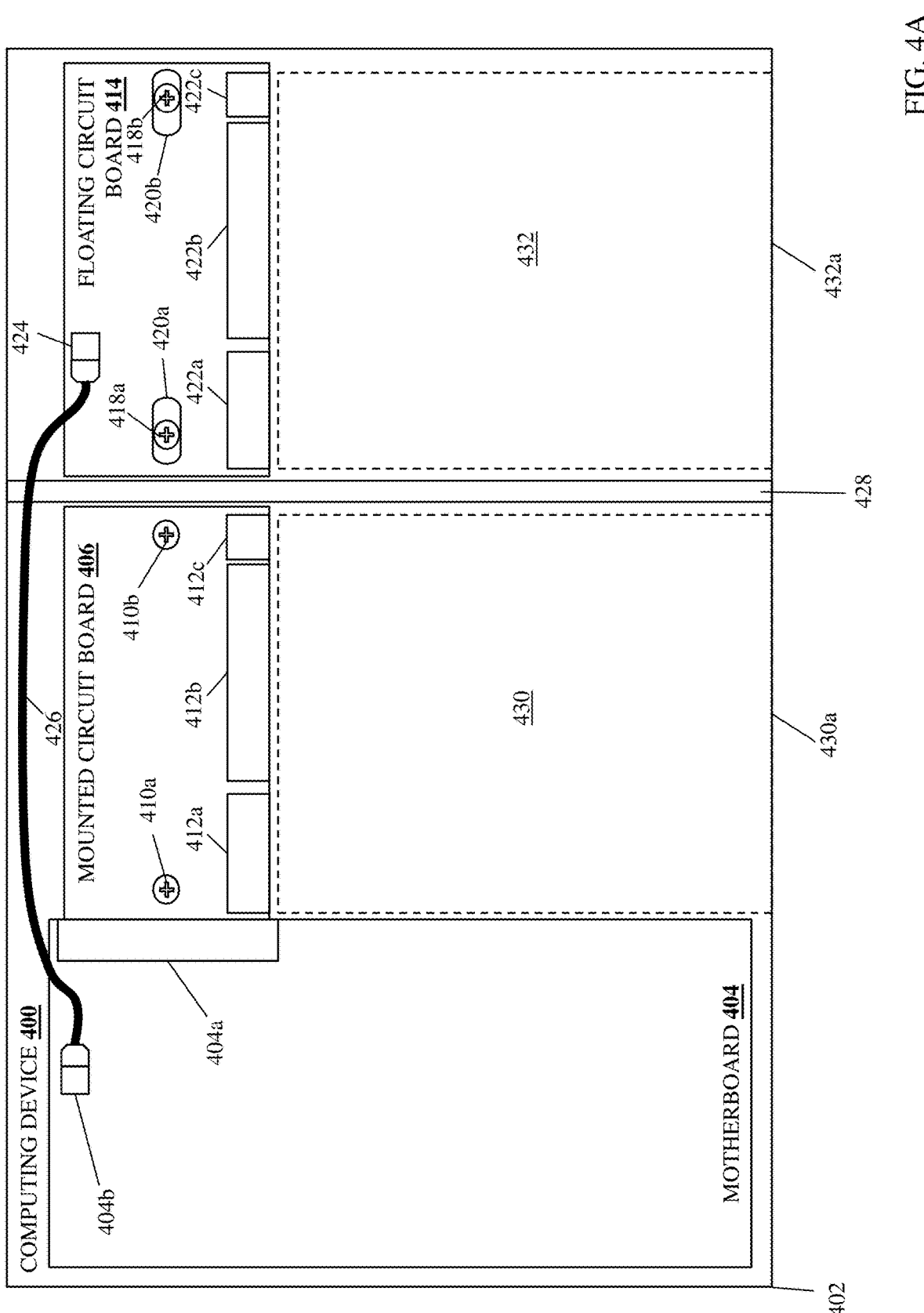
FIG. 4A is a schematic top view illustrating an embodiment of a computing device that includes the mounted circuit board/floating circuit board component connection system of the present disclosure.

Referring now to FIGS. 4A and 4B, an embodiment of a computing device 400 is illustrated that includes the mounted circuit board/floating circuit board component connection system of the present disclosure. In an embodiment, the computing device 400 may be provided by the IHS 100 discussed above with reference to FIG. 1 and/or may include some or all of the components of the IHS 100, and in specific examples may be provided by a server device. However, while illustrated and discussed as being provided by a server device, one of skill in the art in possession of the present disclosure will recognize that the functionality of the computing device 400 discussed below may be provided by other devices that are configured to operate similarly as the computing device 400 discussed below.

In the illustrated embodiment, the computing device 400 includes a chassis 402 that houses the components of the computing device 400, only some of which are illustrated and described below. For example, the chassis 402 may house a motherboard 404 that may be mounted to the chassis 402 using any of a variety of motherboard mounting techniques known in the art, and one of skill in the art in possession of the present disclosure will appreciate how the motherboard 404 may support a processing system (e.g., the processor 102 discussed above with reference to FIG. 1 such as a Central Processing Unit (CPU)), a memory system (e.g., the memory 114 discussed above with reference to FIG. 1 such as a Dynamic Random Access Memory (DRAM) system), and/or any other motherboard-supported components that would be apparent to one of skill in the art in possession of the present disclosure. In the illustrated embodiments, the motherboard 404 includes a mounted circuit board connector 404a and a cable connector 404b. However, while the computing device 400 is illustrated and described as including a motherboard 404, one of skill in the art in possession of the present disclosure will appreciate how the motherboard 404 may be omitted from the computing device 400 while remaining within the scope of the present disclosure as well.

As can be seen in FIGS. 4A and 4B, the chassis 402 also houses a mounted circuit board 406 which, in the example illustrated and described below, is connected to the mounted circuit board connector 404a (e.g., a "connector" edge on the mounted circuit board 406 is mated with a connector slot defined by the mounted circuit board connector 404a), engaged with a mounted circuit board support member 408 that extends from the chassis 402 and into engagement with a surface of the mounted circuit board 406 to support the mounted circuit board 406 in the illustrated embodiment, and is mounted to the chassis 402 via a pair of mounting elements 410a and 410b (e.g., screws that extend through screw apertures defined by the mounted circuit board 406 and into screw apertures defined by the chassis 402, as can be seen in FIG. 4B). However, while a specific example of the mounting of the mounted circuit board 406 to the chassis 402 has been illustrated and described, one of skill in the art in possession of the present disclosure will appreciate how the mounted circuit board 406 may be mounted to the chassis 402 in a variety of manners that will fall within the scope of the present disclosure as well.

The mounted circuit board 406 includes a plurality of component connectors. In the examples illustrated and described below, the plurality of component connectors are provided by a set of conventional PMM component connectors that one of skill in the art will recognize include a component connector 412a that is provided by a ×16 PCIe connector; a component connector 412b that provides a ×16 PCIe connection, a sideband signal connection, and a 200 watt power connection; and a component connector 412c that is provided by a 400 W power connector. However, one of skill in the art in possession of the present disclosure will appreciate how the mounted circuit board 406 may be provided with only the component connector 412b in some embodiments (e.g., embodiments in which the mounted circuit board 406 is configured to provide the connection for the "base-feature" conventional PMM components discussed above). Furthermore, while a mounted circuit board 406 having particular configurations of component connectors has been illustrated and described, one of skill in the art in possession of the present disclosure will appreciate how the mounted circuit board of the present disclosure may include a variety of component connector configurations that will fall within the scope of the present disclosure as well.

The illustrated embodiment provides an example of the mounting of the mounted circuit board 406 to the chassis 402 via its connection to the mounted circuit board connector 404a on the motherboard 404 (which is in turn mounted to the chassis 402 as described above), its engagement with the circuit board support member 408, and the engagement of the mounting elements 410a and 410b with the mounted circuit board 406 and the chassis 402, which one of skill in the art in possession of the present disclosure will appreciate operates to resist movement of the mounted circuit board 406 relative to the chassis 402. For example, while the mounting of the mounted circuit board 406 to the chassis 402 may allow portions of the mounted circuit board 406 (e.g., the corners of the mounted circuit board 406 opposite the connection to the mounted circuit board connector 404a in the FIG. 4A) to flex and/or otherwise move nominal distances relative to the chassis 402, the movement of the mounted circuit board 406 and the component connectors 412a-412c relative to the chassis 402 is resisted such that the component connectors 412a-412c may be considered stationary relative to the chassis 402.

As can be seen in FIGS. 4A and 4B, the chassis 402 also houses a floating circuit board 414 which, in the example illustrated and described below, is engaged with a resilient floating circuit board support member 416 that extends from the chassis 402 and into engagement with a surface of the floating circuit board 414 in the illustrated embodiment, and is moveably coupled to the chassis 402 via a pair of coupling elements 418a and 418b (e.g., screws) that extend through slots 420a and 420b (e.g., screw slots) defined by the floating circuit board 414 and into stand-offs 419a and 419b, respectively, that extend from the chassis 402, as can be seen in FIG. 4B. However, while a specific example of the moveable coupling of the floating circuit board 414 to the chassis 402 has been illustrated and described, one of skill in the art in possession of the present disclosure will appreciate how the floating circuit board 414 may be moveably coupled to the chassis 402 in a variety of manners that will fall within the scope of the present disclosure as well. For example, while the resilient floating circuit board support member 416 is conceptually illustrated as a spring that allow the relative movement between the floating circuit board 414 and the chassis 402, one of skill in the art in possession of the present disclosure will appreciate how that relative movement may be enabled in a variety of manners that will fall within the scope of the present disclosure as well.

The floating circuit board 414 includes a plurality of component connectors. In the examples illustrated and described below, the plurality of component connectors are provided by a set of conventional PMM component connectors that one of skill in the art will recognize include a component connector 422a that is provided by a ×16 PCIe connector; a component connector 422b that provides a ×16 PCIe connection, a sideband signal connection, and a 200 watt power connection; and a component connector 422c that is provided by a 400 W power connector. However, one of skill in the art in possession of the present disclosure will appreciate how the floating circuit board 414 may be provided with only the component connector 422b in some embodiments (e.g., embodiments in which the floating circuit board 414 is configured to provide the connection for the "base-feature" conventional PMM components described above). Furthermore, while a floating circuit board 414 having a particular configuration of component connectors has been illustrated and described, one of skill in the art in possession of the present disclosure will appreciate how the floating circuit board of the present disclosure may include a variety of component connector configurations that will fall within the scope of the present disclosure as well.

The illustrated embodiment provides an example of the moveable coupling of the floating circuit board 414 to the chassis 402 via its engagement with the resilient floating circuit board support member 416, and the engagement of the mounting elements 420a and 420b with the floating circuit board 414 and the chassis 402 while positioned in the slots 420a and 420b, respectively, defined by the floating circuit board 414, which as discussed below operates to allow movement of the floating circuit board 414 relative to the chassis 402 in two axes. As such, one of skill in the art in possession of the present disclosure will appreciate how the moveable coupling of the floating circuit board 414 to the chassis 402 allows the floating circuit board 414 and its component connectors 422a-422c to move relative to the mounted circuit board 406 and its component connectors 412a-412c.

In the embodiments illustrated and described below, the floating circuit board 414 includes a cable connector 424 (not visible in FIG. 4B), and a cable 426 is connected to each of the cable connector 424 on the floating circuit board 414 and the cable connector 404b on the motherboard 404 to "cable" the floating circuit board 414 to the motherboard 404. Furthermore, while the mounted circuit board 406 is illustrated and described herein as being plugged into the mounted circuit board connector 404a on the motherboard 404, one of skill in the art in possession of the present disclosure will appreciate how the mounted circuit board 406 may be cabled to the motherboard 404 similarly as described above for the floating circuit board 414 (i.e., while still being mounted to the chassis 402 as described above). Further still, as discussed above the motherboard 404 may be omitted in some embodiments, and thus the mounted circuit board 406 may be mounted to the chassis 402 while plugged into and/or cabled to one or more components, and the floating circuit board 414 may be moveably coupled to the chassis 402 while being cabled to one or more components, while remaining within the scope of the present disclosure as well.

In the embodiments illustrated and described below, a removeable chassis wall 428 is included in the chassis 402, and one of skill in the art in possession of the present disclosure will appreciate how the chassis 402 may include any of a variety of removeable chassis wall connection subsystems that allow the removable chassis wall 428 to be connected to and disconnected from the chassis 402 as described below. As illustrated in FIG. 4A, with the removable chassis wall 428 provided in the chassis 402, a pair of conventional component housings 430 and 432 are defined adjacent the mounted circuit board 406 and the floating circuit board 414 and on opposite sides of the removable chassis wall 428, with a respective conventional component entrance 430a and 432a defined by the chassis 402 adjacent each of the conventional component housings 430 and 432, respectively.

While not illustrated, one of skill in the art in possession of the present disclosure will appreciate how the chassis 402, the removable chassis wall 428, and/or other elements of the computing device 400 may include component guide features, component alignment features, and/or other features for allowing components to be connected to the mounted circuit board 406 and floating circuit board 414 as described below. However, while a specific computing device 400 has been illustrated and described, one of skill in the art in possession of the present disclosure will recognize that computing devices (or other devices operating according to the teachings of the present disclosure in a manner similar to that described below for the computing device 400) may include a variety of components and/or component configurations for providing conventional computing device functionality, as well as the mounted circuit board/floating circuit board component connection functionality discussed below, while remaining within the scope of the present disclosure as well.

Referring now to FIG. 5, an embodiment of a method 500 for using a mounted circuit board and a floating circuit board to connect a component to a computing device is illustrated. As discussed below, the systems and methods of the present disclosure provide for the relative movement of a floating circuit board and a mounted circuit board so that a plurality of first component connectors on the mounted circuit board and a plurality of second component connectors on the floating circuit board may be coupled to the same component. For example, the mounted circuit board/floating circuit board component connection system for the present disclosure may include a computing device chassis. A mounted circuit board includes a plurality of first component connectors that are configured to connect to a component, and is mounted to the computing device chassis such that relative movement of the mounted circuit board and the computing device chassis is resisted. A floating circuit board includes a plurality of second component connectors that are configured to connect to the component, and is moveably coupled to the computing device chassis such that the floating circuit board is configured to move relative to the computing device chassis when the component connects to the plurality of first component connectors included on the mounted circuit board. As such, pin alignment issues associated with enabling the connection of multiple sets of multiple computing device connectors on a component to corresponding sets of component connectors on the same circuit board in a computing device are addressed.

Figure 6A:
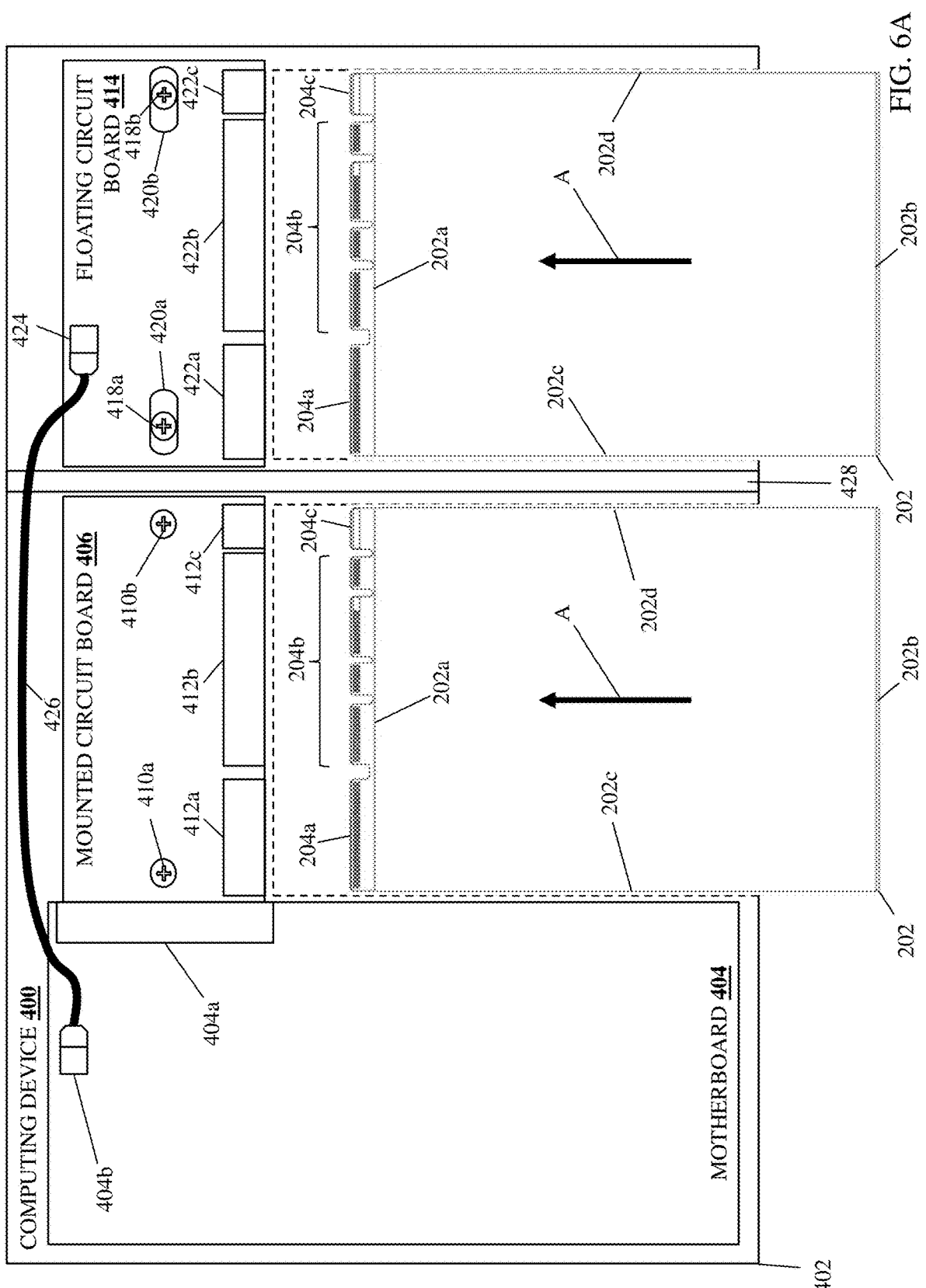
FIG. 6A is a schematic top view illustrating an embodiment of the conventional component of FIG. 2 being connected to the computing device of FIGS. 4A and 4B.
Figure 6B:
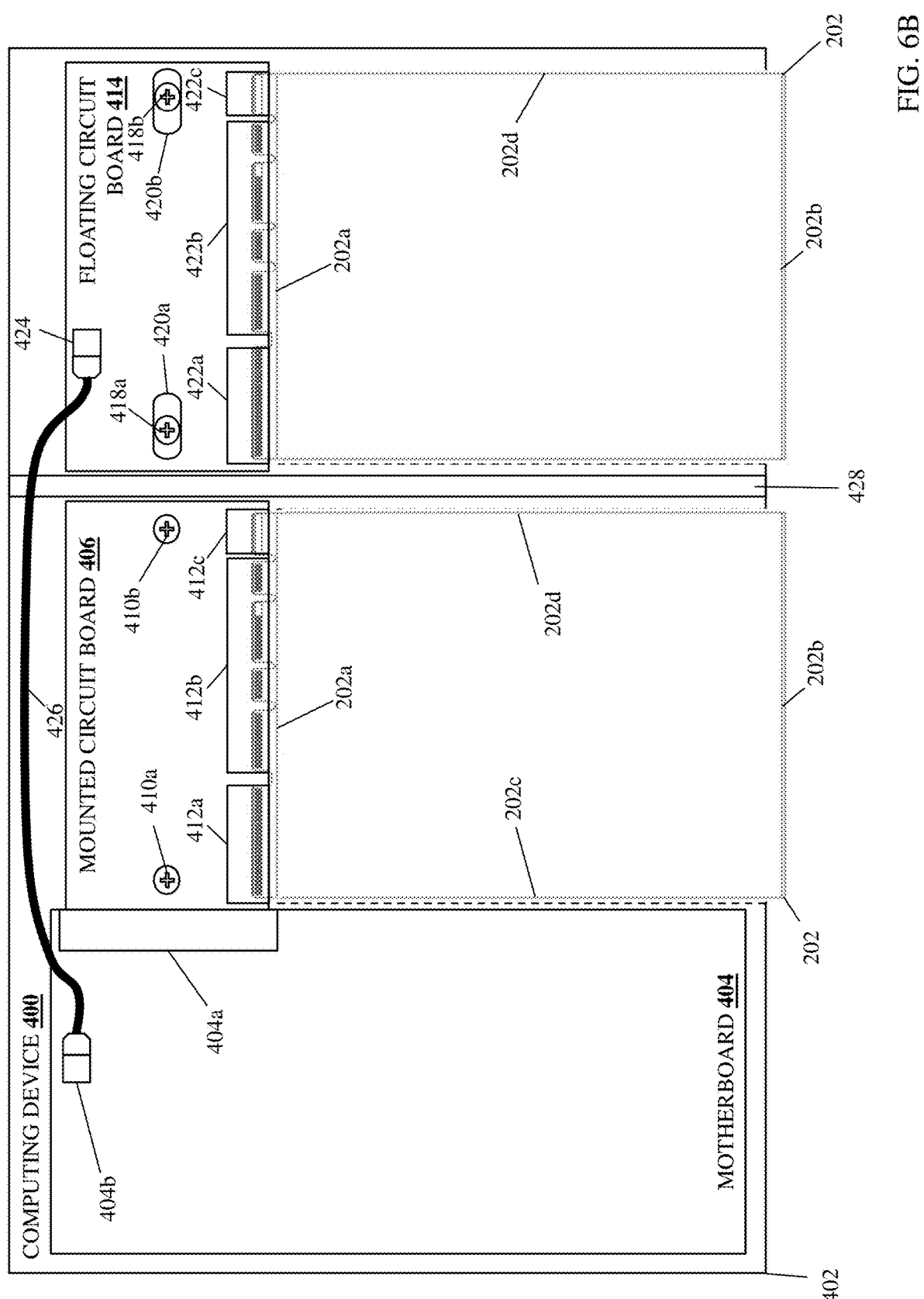
FIG. 6B is a schematic top view illustrating an embodiment of the conventional component of FIG. 2 connected to the computing device of FIGS. 4A and 4B.

The method 500 begins at block 502 where respective second components are connected to a computing device via a mounted circuit board and a floating circuit board. With reference to FIG. 6A, in an embodiment of block 502, a respective conventional component 200 may be positioned adjacent the conventional component entrances 430a and 432a defined by the chassis 402 of the computing device 400 and may each be moved in a direction A such that they move through those conventional component entrances 430a and 432a and enter the conventional component housings 430 and 432, respectively. As illustrated in FIG. 6B, continued movement of the first of those conventional components 200 in the direction A will cause its computing device connectors 204a and 204c to mate with the component connectors 412a and 412c on the mounted circuit board 406, and its computing device connector set 204b to mate with the component connector 412b on the mounted circuit board 406.

Similarly, continued movement of the second of those conventional components 200 in the direction A will cause its computing device connectors 204a and 204c to mate with the component connectors 422a and 422c on the floating circuit board 414, and its computing device connector set 204b to mate with the component connector 422b on the floating circuit board 414. However, as discussed above, some embodiments of the present disclosure may only provide the connectors 412b and 422b on the mounted circuit board 406 and floating circuit board 414, respectively, as thus at block 502 only the computing device connector set 204b on the first of the conventional components 200 may mate with the component connector 412b on the mounted circuit board 406, and only the computing device connector set 204b on the second of the conventional components 200 may mate with the component connector 422b on the mounted circuit board 406 at block 502. As will be appreciated by one of skill in the art in possession of the present disclosure, following block 502, the conventional components 200 may perform any of a variety of functionality known in the art with motherboard 404 and via the mounted circuit board 406 (and mounted circuit board connector 404a) and the floating circuit board 414 (and the cable 426).

The method 500 then proceeds to block 504 where the computing device is configured to connect a first component to the mounted circuit board and the floating circuit board. In an embodiment, at block 504, a user or administrator of the computing device 400 may wish to use the component 300 discussed above with reference to FIG. 3 with the computing device 300 and, in response, may disconnect the conventional components 200 discussed above with reference to block 502 from the computing device 400 by moving each of those conventional components opposite the direction A and out of the component housings 430 and 432 via the conventional component entrances 430a and 432a, respectively.

Figure 7A:
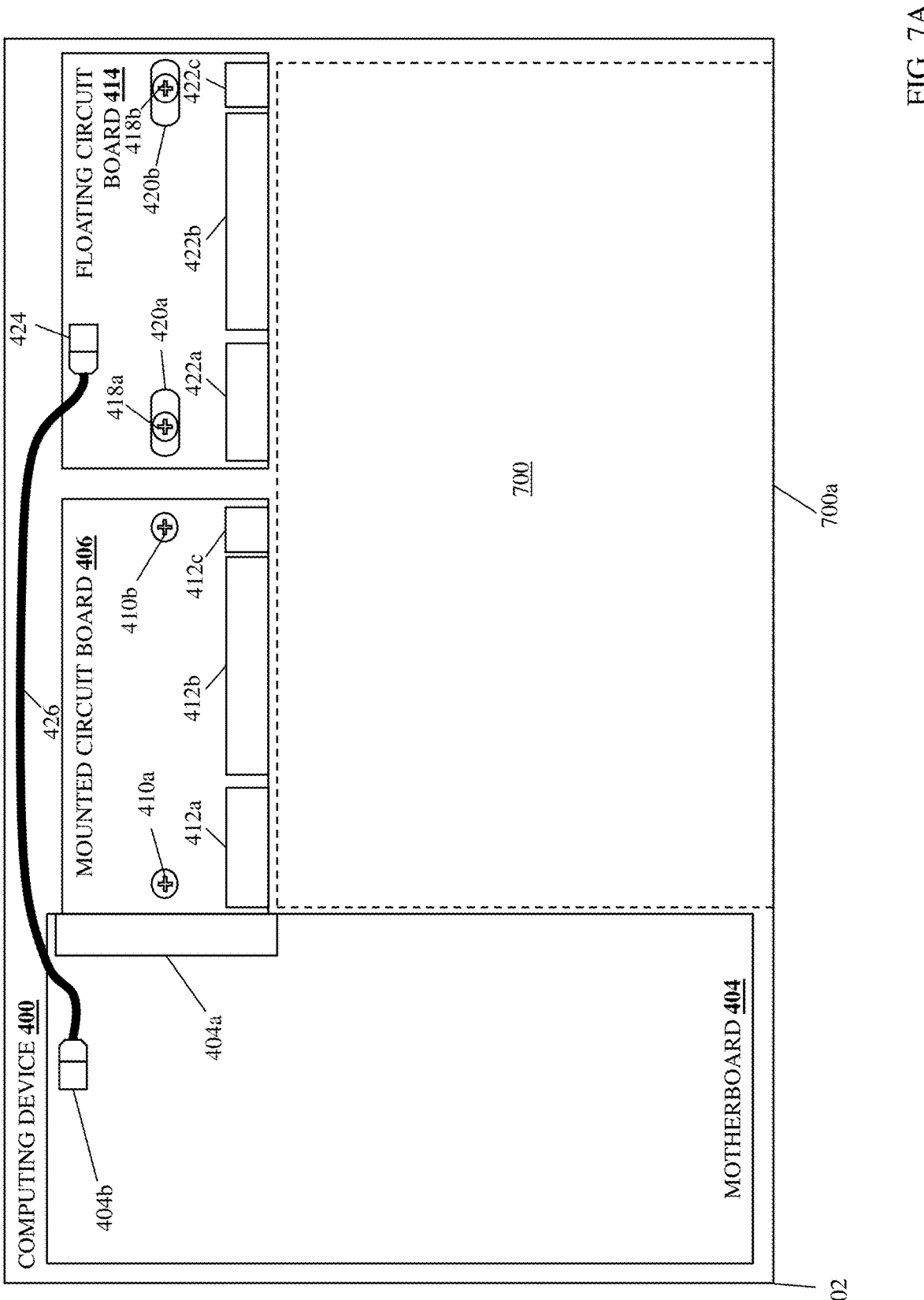
FIG. 7A is a schematic top view illustrating an embodiment of the computing device of FIGS. 4A and 4B configured for connection of the component of FIG. 3 during the method of FIG. 5.
Figure 7B:
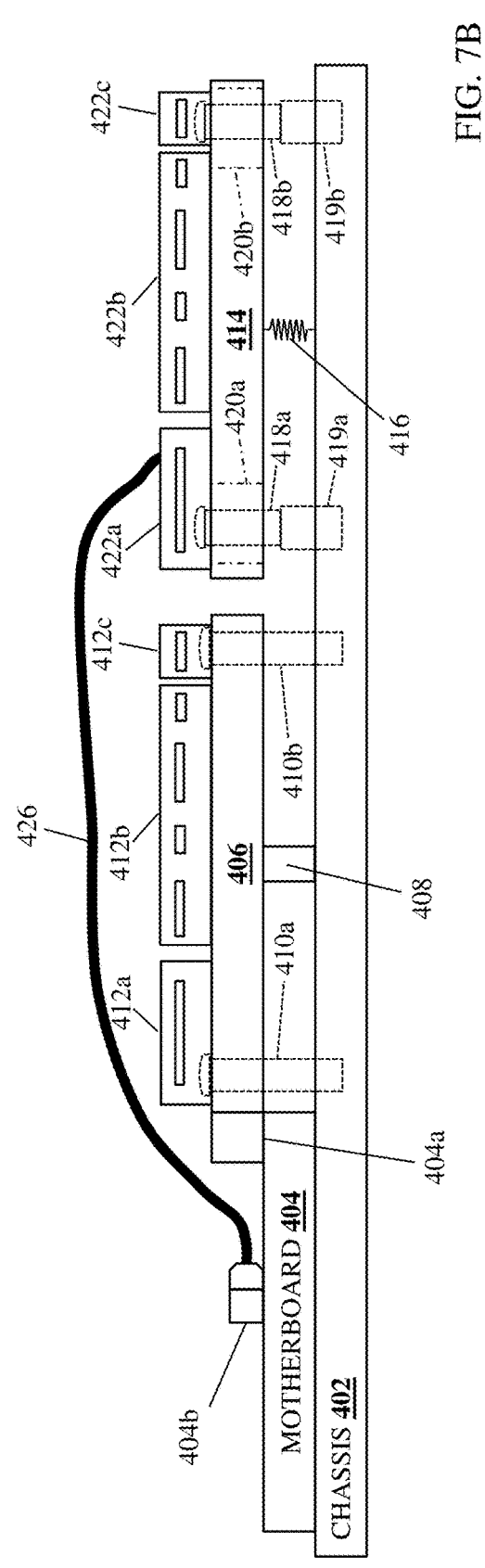
FIG. 7B is a schematic front view illustrating an embodiment of the computing device of FIGS. 4A and 4B configured for connection of the component of FIG. 3 during the method of FIG. 5.

With reference to FIGS. 7A and 7B, the user or administrator of the computing device 400 may then remove the removable chassis wall 428 from the chassis 402 by, for example, disconnecting the removable chassis wall 428 from the removeable chassis wall connection subsystems described above. As can be seen in FIG. 7A, the removal of the removable chassis wall 428 from the chassis 402 operates to define a component housing 700 adjacent both the mounted circuit board 406 and the floating circuit board 414, with a component entrance 700a defined by the chassis 402 adjacent the component housing 700. As such, the present disclosure contemplates the chassis 400 having a pair of conventional component bays and being convertible (via the removal of the removable chassis wall 428 in the illustrated embodiment) to provide a "double-wide" component bay.

Figure 8A:
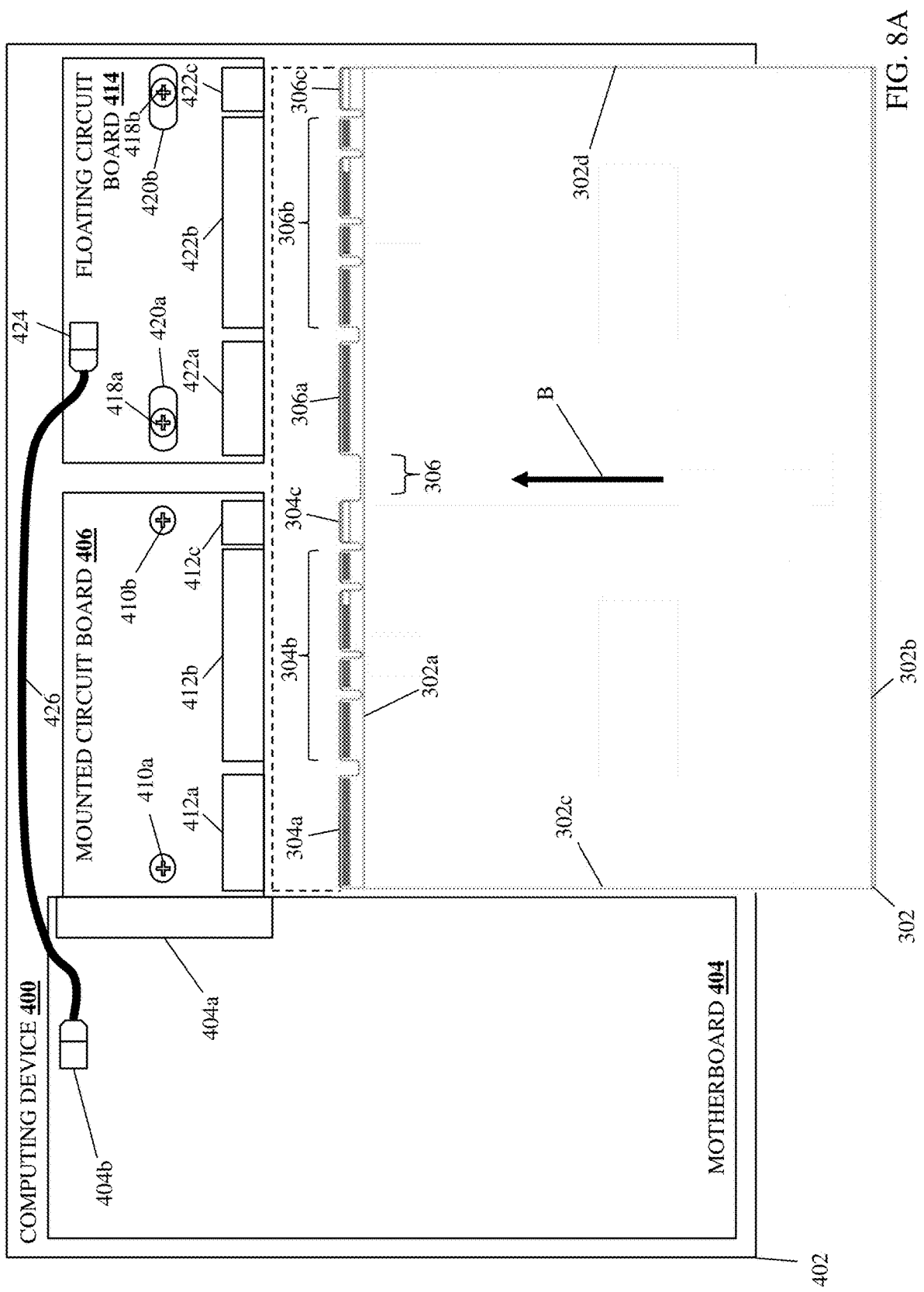
FIG. 8A is a schematic top view illustrating an embodiment of the component of FIG. 3 being connected to the computing device of FIGS. 4A and 4B during the method of FIG. 5.

Following block 504, the method 500 may proceed to both block 506 and blocks 508a, 508b, and 508c, which as discussed below describe the connection of the first component to each of the mounted circuit board and floating circuit board at substantially the same time. As such, following block 504, the method 500 may proceed to block 506 where first component connectors on the mounted circuit board connect to the first component while movement of the mounted circuit board relative to the computing device is resisted. With reference to FIG. 8A, in an embodiment of block 506, the component 300 may be positioned adjacent the component entrance 700a defined by the chassis 402 of the computing device 400 and moved in a direction B such that it moves through component entrance 700a and enters the component housing 700.

Figure 8B:
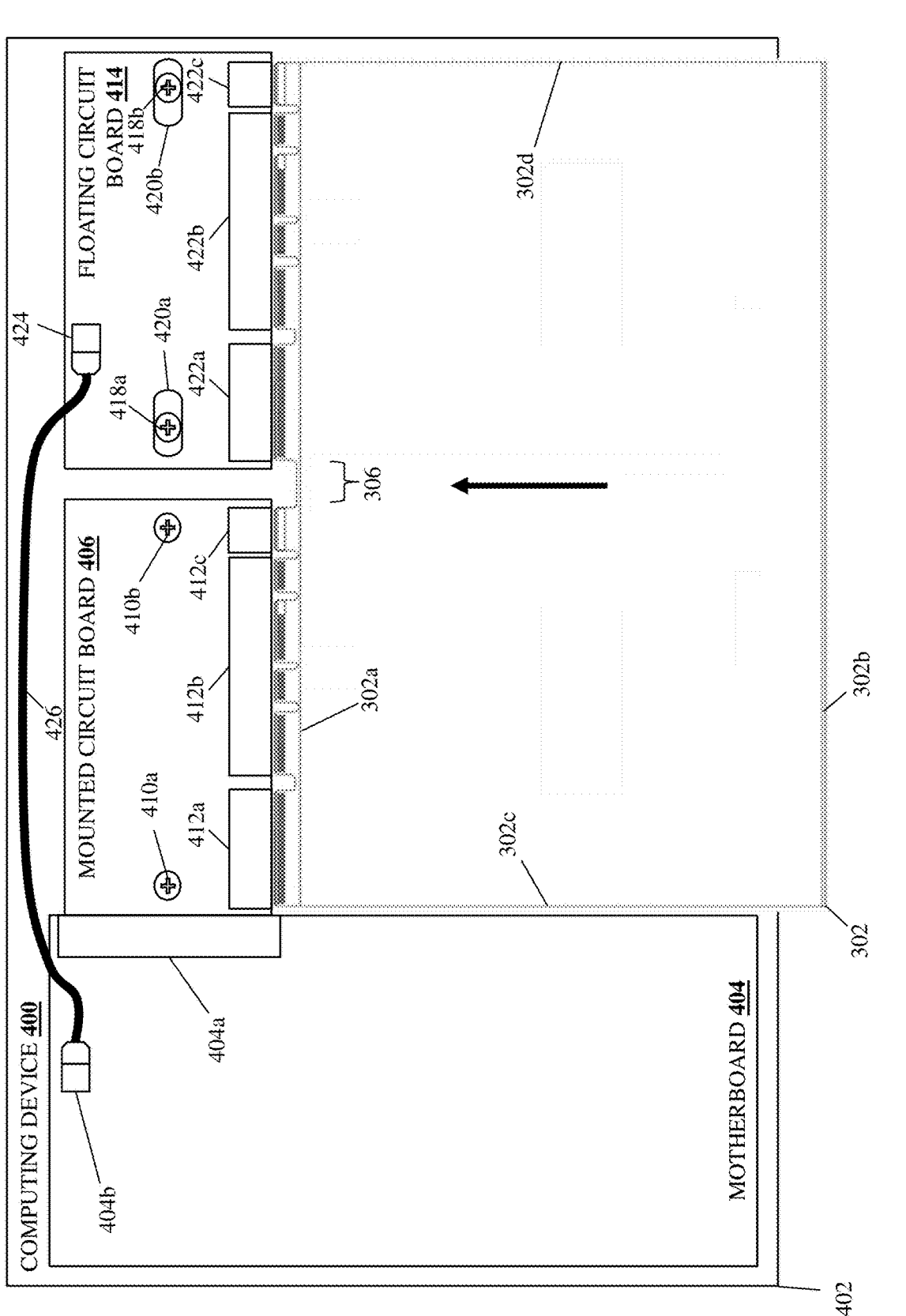
FIG. 8B is a schematic top view illustrating an embodiment of the component of FIG. 3 being connected to the computing device of FIGS. 4A and 4B during the method of FIG. 5.
Figure 8D:
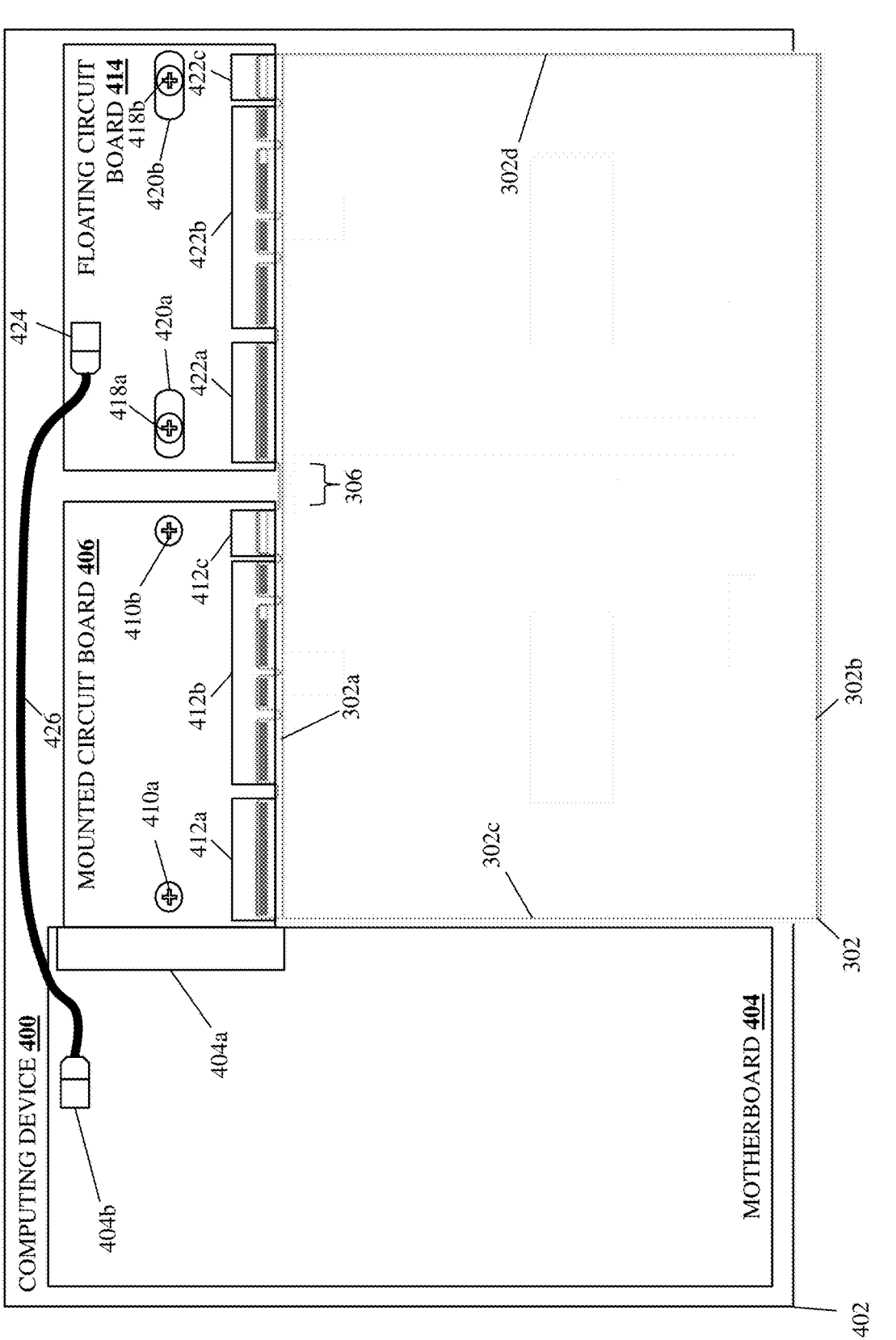
FIG. 8D is a schematic top view illustrating an embodiment of the component of FIG. 3 connected to the computing device of FIGS. 4A and 4B during the method of FIG. 5.

As illustrated in FIGS. 8B and 8D, continued movement of the component 300 in the direction B will cause the computing device connectors 304a and 304c to mate with the component connectors 412a and 412c on the mounted circuit board 406, and the computing device connector set 304b to mate with the component connector 412b on the mounted circuit board 406.

Also following block 504, the method 500 may proceed to block 508a where second component connectors on the floating circuit board engage the first component while the first component is connected to the first component connectors on the mounted circuit board. With reference back to FIG. 8A, in an embodiment of block 508a and as discussed above with reference to block 506, the component 300 may be positioned adjacent the component entrance 700a defined by the chassis 402 of the computing device 400 and moved in the direction B such that it moves through component entrance 700a and enters the component housing 700. As illustrated in FIG. 8B, continued movement of the component 300 in the direction B will cause the computing device connectors 306a and 306c to engage the component connectors 422a and 422c on the floating circuit board 414, and the computing device connector set 306b to engage the component connector 422b on the floating circuit board 414.

The method 500 then proceeds to block 508b where second component connectors and the floating circuit move relative to the computing device in response to engagement with the first component and while the first component is connected to the first component connectors on the mounted circuit board. With reference to FIGS. 8B and 8C, in an embodiment of block 508b, the engagement of the computing device connectors 306a and 306c with the component connectors 422a and 422c on the floating circuit board 414, and the engagement of the computing device connector set 306b with the component connector 422b on the floating circuit board 414, may cause the floating circuit board 414 to move relative to the chassis in the X axis and Z axis illustrated in FIG. 8C. However, as discussed above, some embodiments of the present disclosure may only provide the connector 422b on the floating circuit board 414, and thus at block 508b only the computing device connector set 306b on the component 300 may engage the component connector 422b on the floating circuit board 414 and cause the floating circuit board 414 to move relative to the chassis in the X axis and Z axis.

For example, and as will be appreciated by one of skill in the art in possession of the present disclosure, the mounting of the mounted circuit board 406 to the chassis 402 provides the component connectors 412a, 412b, and 412c on the mounted circuit board 406 in a relatively stationary position (i.e., as the mounting of the mounted circuit board 406 to the chassis 402 resists relative movement of the mounted circuit board 406 and the chassis 402, thus keeping the component connectors 412a-412c relatively stationary), and conventional techniques may be used to achieve the pin alignment required to enable the connection of the computing device connectors 304a and 304c and the computing device connector set 304b on the component 300 to the respective component connectors 412a, 412b, and 412c in the relatively stationary mounted circuit board 406.

However, as discussed above, achieving the pin alignment required to also enable the connection of the computing device connectors 306a and 306c and the computing device connector set 306b on the component 300 to multiple component connectors on the same circuit board as the component connectors 412a, 412b, and 412c is relatively difficult, and will likely present pin alignment issues that may prevent their connection to the computing device connectors 306a and 306c and the computing device connector set 306b on the component 300. However, the moveable coupling of the floating circuit board 414 to the chassis 402 allows the component connectors 422a, 422b, and 422c on the floating circuit board 414 to move relative to the relatively stationary mounted circuit board 406 and its component connectors 412a, 412b, and 412c, and thus will allow those component connectors 422a, 422b, and 422c to move into alignment with the computing device connectors 306a and 306c and the computing device connector set 306b on the component 300 while the computing device connectors 304a and 304c and the computing device connector set 304b on the component 300 mate with the respective component connectors 412a, 412b, and 412c.

In the specific examples illustrated and described herein, the resilient floating circuit board support member 416 that extends from the chassis 402 and into engagement with a surface of the floating circuit board 414, and the pair of coupling elements 418a and 418b that extend through the slots 420a and 420b defined by the floating circuit board 414 and into engagement with the stand-offs 419a and 419b, respectively, that extend from the chassis 402, allow the floating circuit board 414 and the component connectors 422a, 422b, and 422c to move in two axes: along the "X" axis and right-to-left in FIG. 8C (i.e., relative to the coupling elements 418a and 418b and along the length of the slots 420a and 420b, respectively), and along the "Z" axis and up-and-down in FIG. 8C to decrease and increase the distance between the floating circuit board 414 and the chassis 402 (i.e., via the resiliency of the resilient floating circuit board support member 416 and along the length of the coupling elements 418a and 418b between the stand-offs 419a and 419b, respectively, and the tops of the coupling elements 418a and 418b). However, while specific axes of movement of the floating circuit board are described using particular structural/support features, one of skill in the art in possession of the present disclosure will appreciate how a variety of different movement (e.g., single axis movement, movement in other axes) may be enabled via any of a variety of structural/support features while remaining within the scope of the present disclosure as well.

The method 500 then proceeds to block 508c where second component connectors on the floating circuit board connect to the first component. With reference back to FIG. 8D, in an embodiment of block 508c, the continued movement of the component 300 in the direction B, the mating of the computing device connectors 304a and 304c and the computing device connector set 304b on the component 300 with the respective component connectors 412a, 412b, and 412c on the mounted circuit board 406, and the alignment of the component connectors 422a, 422b, and 422c on the floating circuit board 414 with the computing device connectors 306a and 306c and the computing device connector set 306b on the component 300, will allow the computing device connectors 306a and 306c and the computing device connector set 306b on the component 300 to mate with the component connectors 422a, 422b, and 422c on the floating circuit board 414.

As will be appreciated by one of skill in the art in possession of the present disclosure, following block 504 and 508c, the component 300 may perform any of a variety of functionality known in the art with motherboard 404 via the mounted circuit board 406 (and mounted circuit board connector 404a) and the floating circuit board 414 (and the cable 426). For example, returning to the specific embodiment in which the component 300 is a "double-wide" PMM component, the 32 PCIe lanes provided by the computing device connectors 304 on the component 300 may be connected to a host processor on the motherboard 404, and the other 32 PCIe lanes provided by the computing device connectors 306 on the component 300 may be connected to one or more other resources.

In another example, the 64 PCIe lanes provided by the computing device connectors 304 and 306 on the component 300 may be used to increase a communications bandwidth between a host processor on the motherboard 404 and one or more subsystems (e.g., a GPU and its supporting subsystems) on the component 300. In yet another example, the component 300 may provide two separate but "tightly-coupled" PMM subsystems (e.g., with a first PMM subsystem with a Field Programmable Gate Array (FPGA) using the computing device connectors 304 on the component 300, and a second PMM subsystem with a System on Chip (SoC) using the computing device connectors 306 on the component 300) that are connected together by a high-speed communication interface (e.g., a PCIe bus). As such, one of skill in the art in possession of the present disclosure will appreciate how any of a variety of functionality may be enabled on the component 300 while remaining within the scope of the present disclosure.

Thus, systems and methods have been described that provide for the relative movement of a floating circuit board and a mounted circuit board so that a plurality of first component connectors on the mounted circuit board and a plurality of second component connectors on the floating circuit board may be coupled to the same component. For example, the mounted circuit board/floating circuit board component connection system for the present disclosure may include a computing device chassis. A mounted circuit board includes a plurality of first component connectors that are configured to connect to a component, and is mounted to the computing device chassis such that relative movement of the mounted circuit board and the computing device chassis is resisted. A floating circuit board includes a plurality of second component connectors that are configured to connect to the component, and is moveably coupled to the computing device chassis such that the floating circuit board is configured to move relative to the computing device chassis when the component connects to the plurality of first component connectors included on the mounted circuit board. As such, pin alignment issues associated with enabling the connection of multiple sets of multiple computing device connectors on a component to corresponding sets of component connectors on the same circuit board in a computing device are addressed.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A mounted circuit board/floating circuit board component connection system, comprising:
   a computing device chassis that includes a mounting surface;
   a motherboard that is mounted to the computing device chassis in parallel with the mounting surface;
   a mounted circuit board that includes a plurality of first component connectors that are configured to connect to a component, wherein the mounted circuit board is mounted to the computing device chassis such that relative movement of the mounted circuit board and the computing device chassis is resisted;
   a floating circuit board that defines a plurality of slots and includes a plurality of second component connectors that are configured to connect to the component, wherein the floating circuit board is cabled to the motherboard and moveably coupled to the computing device chassis via a respective coupling element that extends from the mounting surface through each of the plurality of slots to configure the floating circuit board to move along the plurality of slots relative to the computing device chassis when the component connects to the plurality of first component connectors included on the mounted circuit board; and
   a resilient floating circuit board support member that extends from the mounting surface and into engagement with the floating circuit board to configure the floating circuit board to move relative to the computing device chassis in two axes.

2. The system of claim 1, wherein the plurality of first component connectors are provided by a first set of Pluggable Multipurpose Module (PMM) component connectors, and the plurality of second component connectors are provided by a second set of PMM component connectors.

3. The system of claim 1, wherein the plurality of slots defined by the floating circuit board are provided by two slots.

4. The system of claim 1, wherein each respective coupling element extends from the mounting surface via a respective stand-off.

5. The system of claim 1, further comprising:
   a first circuit board connector that is mounted to the motherboard, wherein the first circuit board is plugged into the first circuit board connector.

6. The system of claim 1, further comprising:
   a removeable chassis wall that is positioned in the computing device chassis between the mounted circuit board and the floating circuit board, and that is configured to be removed from the computing device chassis to allow the component to be positioned in the computing device chassis and connected to the plurality of first component connectors included on the mounted circuit board and the plurality of second component connectors included on the floating circuit board.

7. An Information Handling System (IHS), comprising:
   a first component;
   a computing device having a computing device chassis that includes a mounting surface;
   a motherboard that is mounted to the computing device in parallel with the mounting surface;
   a mounted circuit board that includes a plurality of first component connectors that are connected to the first component, wherein the mounted circuit board is mounted to the computing device to resist relative movement of the mounted circuit board and the computing device;
   a floating circuit board that defines a plurality of slots and includes a plurality of second component connectors that are connected to the first component, wherein the floating circuit board is cabled to the motherboard and moveably coupled to the chassis via a respective coupling element that extends from the mounting surface through each of the plurality of slots to allow relative movement of the floating circuit board and the computing device along the plurality of slots when the first component connects to the plurality of first component connectors included on the mounted circuit board; and
   a resilient floating circuit board support member that extends from the mounting surface and into engagement with the floating circuit board to configure the floating circuit board to move relative to the computing device in two axes.

8. The IHS of claim 7, wherein the plurality of first component connectors are provided by a first set of Pluggable Multipurpose Module (PMM) component connectors, and the plurality of second component connectors are provided by a second set of PMM component connectors.

9. The IHS of claim 7, wherein the plurality of slots defined by the floating circuit board are provided by two slots.

10. The IHS of claim 7, wherein each respective coupling element extends from the mounting surface via a respective stand-off.

11. The IHS of claim 7, further comprising:
   a first circuit board connector that is mounted to the motherboard, wherein the first circuit board is plugged into the first circuit board connector.

12. The IHS of claim 7, further comprising:
   wherein the computing device includes a removeable chassis wall connection subsystem that is located between the mounted circuit board and the floating circuit board, wherein the removable chassis wall connection subsystem is configured to connect to a removable chassis wall when the first component is removed from the computing device in order to position the removeable chassis wall in the computing device between the mounted circuit board and the floating circuit board.

13. The IHS of claim 7, wherein the plurality of first component connectors on the mounted circuit board and the plurality of second component connectors on the floating circuit board are each configured to connect to a respective second component that has different dimensions than the first component.

14. A method for connecting a component to a computing device using a mounted circuit board and a floating circuit board, comprising:

connecting, by a plurality of first component connectors on a mounted circuit board that is mounted to a computing device chassis that includes a mounting surface, to a first component while the mounting of the mounted circuit board to the computing device chassis resists relative movement of the mounted circuit board and the computing device chassis;

moving, by a floating circuit board that is 1) cabled to a motherboard mounted to the computing device chassis in parallel with the mounting surface and 2) movably coupled to the computing device via a respective coupling element that extends from the mounting surface through each of a plurality of slots defined by the floating circuit board and while the first component connects to the plurality of first component connectors on the mounted circuit board, relative to the computing device chassis in response to engagement of the first component and a plurality of second component connectors on the floating circuit board;

connecting, by the plurality of second component connectors on the floating circuit board in response to the relative movement of the floating circuit board and the computing device chassis, to the first component; and moving, by the floating circuit board via a resilient floating circuit board support member that extends from the mounting surface and into engagement with the floating circuit board, relative to the computing device chassis in two axes.

15. The method of claim 14, wherein the plurality of first component connectors are provided by a first set of Pluggable Multipurpose Module (PMM) component connectors, and the plurality of second component connectors are provided by a second set of PMM component connectors.

16. The method of claim 14, wherein the plurality of slots defined by the floating circuit board are provided by two slots.

17. The method of claim 14, wherein each respective coupling element extends from the mounting surface via a respective stand-off.

18. The method of claim 14, wherein the first circuit board is plugged into a first circuit board connector that is mounted to the motherboard.

19. The method of claim 14, wherein the computing device chassis includes a removeable chassis wall connection subsystem that is located between the mounted circuit board and the floating circuit board, and wherein the method further comprises:

disconnecting, by the plurality of first component connectors on the mounted circuit board and the plurality of second component connectors on the floating circuit board, from the first component; and connecting, by the removable chassis wall connection subsystem following the disconnection of the first component from the plurality of first component connectors on the mounted circuit board and the plurality of second component connectors on the floating circuit board, to a removable chassis wall in order to position the removeable chassis wall in the computing device chassis between the mounted circuit board and the floating circuit board.

20. The method of claim 19, further comprising:

connecting, by the plurality of first component connectors on the mounted circuit board, to a second component that has different dimensions than the first component; and connecting, by the plurality of second component connectors on the floating circuit board, to a third component that has different dimensions than the first component.

* * * * *